United States Patent
Aihara et al.

(10) Patent No.: US 7,375,046 B2
(45) Date of Patent: May 20, 2008

(54) YTTRIA SINTERED BODY, CERAMIC MEMBER USING YTTRIA SINTERED BODY, AND MANUFACTURING METHOD OF YTTRIA SINTERED BODY

(75) Inventors: Yasufumi Aihara, Nagoya (JP); Hiroto Matsuda, Ogaki (JP)

(73) Assignee: NGK Insulators, Ltd., Nagoya (JP)

( * ) Notice: Subject to any disclaimer, the term of this patent is extended or adjusted under 35 U.S.C. 154(b) by 143 days.

(21) Appl. No.: 11/353,861

(22) Filed: Feb. 14, 2006

(65) Prior Publication Data

US 2006/0199722 A1    Sep. 7, 2006

(30) Foreign Application Priority Data

Feb. 15, 2005   (JP) .............................. 2005-038209

(51) Int. Cl.
*C04B 35/505*   (2006.01)
*C04B 35/584*   (2006.01)

(52) U.S. Cl. .................... 501/152; 501/97.2; 501/97.4; 278/128

(58) Field of Classification Search ............... 501/97.4, 501/97.2, 152; 279/128
See application file for complete search history.

(56) References Cited

U.S. PATENT DOCUMENTS 4,883,776 A      11/1989   Pyzik et al.
2007/0042897 A1*  2/2007   Aihara et al. ............... 501/152

FOREIGN PATENT DOCUMENTS

| JP | 11-79830      | * | 3/1999 |
| JP | 2002-068838 A1 |   | 3/2002 |
| JP | 2002-255647 A1 |   | 9/2002 |

\* cited by examiner

*Primary Examiner*—Karl E Group
(74) *Attorney, Agent, or Firm*—Burr & Brown

(57) ABSTRACT

A yttria sintered body is provided which includes yttria as a principal ingredient and 5 to 40 vol. % silicon nitride, and which exhibits enhanced corrosion resistance and mechanical strength.

18 Claims, 5 Drawing Sheets

YTTRIA SINTERED BODY, CERAMIC MEMBER USING YTTRIA SINTERED BODY, AND MANUFACTURING METHOD OF YTTRIA SINTERED BODY

CROSS REFERENCE TO RELATED APPLICATIONS

This application is based upon and claims the benefit of priority from prior Japanese Patent Application No. 2005-038209, filed on Feb. 15, 2005; the entire contents of which are incorporated herein by reference.

BACKGROUND OF THE INVENTION

1. Field of the Invention

The present invention relates to a yttria sintered body, a ceramic member using the yttria sintered body, and a manufacturing method of the yttria sintered body.

2. Description of the Related Art

Conventional semiconductor manufacturing apparatus and liquid crystal manufacturing apparatus employ an electrostatic chuck or electric heater configured with a ceramic member having a metallic member composed of an electrode or resistance heating element buried therein, the ceramic member being formed, in general, with aluminum nitride or alumina which has high heat resistance and high corrosion resistance.

The yttria sintered body is very excellent in corrosion resistance, and has applications under study, to corrosion-resistive materials to be used in a corrosive gas environment, as disclosed in Japanese Patent Application Laid-Open Publication Nos. 2002-68838 and 2002-255647.

SUMMARY OF THE INVENTION

Recent electrostatic chucks and electric heaters are subject to severer criteria of corrosion resistance than ever. For example, ceramic members are exposed to a plasma environment of severer halogen corrosive gas in their etching process to which an in-situ clearing is introduced, so that avoidance of corrosion is difficult even for ceramic members made of aluminum nitride or alumina.

Then, a highly corrosion-resistant yttria sintered body has an application accepted to ceramic members, causing a new problem. The yttria sintered body is inferior in mechanical strengths such as flexural strength and fracture toughness, so that ceramic members including the yttria sintered body may be damaged in the manufacturing process. For example, cracks or chipping may occur when forming a hole for insertion of a terminal to be joined to a metallic member composed of an electrode or resistance heating element, or thermal stresses may cause a crack when brazing a terminal to a metallic member.

The present invention has been done to solve such a problem.

It therefore is an object the invention to provide a yttria sintered body which has high corrosion resistance and mechanical strength, a ceramic member using the yttria sintered body, and a manufacturing method of the yttria sintered body.

To achieve the object, according to an aspect of the invention, a yttria sintered body includes 5 to 40% by volume of silicon nitride.

According to another aspect of the invention, a ceramic member comprises a base body including at least in part a yttria sintered body including 5 to 40% by volume of silicon nitride, and a metallic member buried in the base body.

According to another aspect of the invention, a manufacturing method of yttria sintered body comprising the steps of preparing raw powder including yttria, and 5 to 40% by volume of silicon nitride, forming the raw powder to form a compact, and sintering the compact in an inactive gaseous atmosphere at temperatures within 1,500 to 2,000° C.

The above and further objects, features and advantages of the invention will more fully appear in the best mode for carrying out the invention, when the same is read in conjunction with the drawings.

BRIEF DESCRIPTION OF THE ACCOMPANYING DRAWINGS

FIG. 3A is a IIB-IIB section of FIG. 3A.

DETAILED DESCRIPTION OF THE PREFERRED EMBODIMENTS

Figure 1:
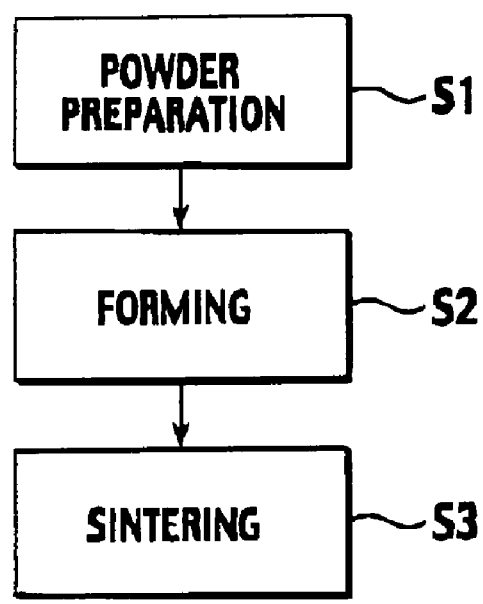
FIG. 1 is a flowchart of steps of a manufacturing method of yttria sintered body according to an embodiment of the invention.

There will be described a yttria sintered body, a ceramic member using the yttria sintered body, and a manufacturing method of the yttria sintered body according to embodiments of the invention, with references made to the drawings.

(Yttria Sintered Body)

A yttria sintered body according to an embodiment of the invention includes yttria ($Y_2O_3$), and 5 to 40% by volume of silicon nitride ($Si_3N_4$). The yttria sintered body has a content of silicon nitride within a range of 5 to 40% by volume. The mechanical strength is not improved in a range of content of silicon nitride below 5% by volume, and the corrosion resistance is significantly reduced in a range of content of silicon nitride above 40% by volume. The yttria sintered body may preferably have a content of silicon nitride within a range of 20 to 30% by volume, to thereby provide a yet enhanced mechanical strength. The content of silicon nitride within 5 to 40% by volume thus allows the yttria sintered body to have an enhanced mechanical strength without undue loss of corrosion resistance.

The yttria sintered body may preferably contain alumina ($Al_2O_3$), silica ($SiO_2$), zirconia ($ZrO_2$), silicon carbide (SiC), etc., as a toughening agent or a sintering additive, besides yttria and silicon nitride, while the contents excluding yttria and silicon nitride may preferably have a total amount controlled under 5% by volume.

The yttria sintered body may preferably have an average grain size thereof within a range of 0.01-5.0 μm, to thereby provide an enhanced mechanical strength, and more preferably have an average grain size of silicon nitride therein within a range of 0.01-5.0 μm, to thereby provide an enhanced flexural strength.

The yttria sintered body may preferably have a flexural strength (in terms of a four-point flexural strength at room temperature to JIS R1601) within a range of 250 MPa or more, and/or a fracture toughness (to JIS R1607) within a range of 1.5 MPa·m$^{1/2}$ or more, and more preferably have a flexural strength (to JIS R1601) within a range of 300 MPa or more, and/or a fracture toughness (to JIS R1607) within a range of 2 MPa·m$^{1/2}$ or more.

The yttria sintered body may preferably have a relative density within a range of 98% or more, for an enhanced mechanical strength and corrosion resistance, and/or an open porosity within a range of 1% or less, for an enhanced volume resistivity, as well.

The yttria sintered body may preferably have a volume resistivity at room temperature (to JIS C2141) within a range of $1 \times 10^{15}$ Ω·cm or more, and a specific inductive capacity (to JIS C2141) within a range of 10 or more, thereby allowing for an enhanced chucking force and dechucking response in the application to a dielectric layer of an electrostatic chuck. The yttria sintered body may more preferably have a volume resistivity at room temperature (to JIS C2141) within a range of $1 \times 10^{16}$ Ω·cm or more, and a specific inductive capacity (to JIS C2141) within a range of 11.5 or more.

The yttria sintered body may preferably have a ratio of change of volume resistivity, between room temperature and 150° C., within a range of one digit or less. More specifically, letting R1 be a volume resistivity at a room temperature, and R2 be that at 150° C., the change ratio is determined by expression (1), such that $$\text{Change ratio} = R1/R2 \tag{1}$$

which should thus be below 10. With a high volume resistivity secured over a wide temperature range, the yttria sintered body provides an excellent function in the application to a dielectric layer of an electrostatic chuck.

A manufacturing method of a yttria sintered body may preferably include a sintering step employing a hot press method, to thereby render the yttria sintered body the more dense, allowing for an enhanced mechanical strength, corrosion resistance, and high volume resistivity, (Manufacturing Method of Yttria Sintered Body)

According to an embodiment of the invention, a manufacturing method of yttria sintered body have, as shown in FIG. 1, the steps of preparing raw powder including yttria, and 5 to 40% by volume of silicon nitride (S1), forming the raw powder to form a compact (S2), and sintering the compact in an inactive gaseous atmosphere at temperatures within a range of 1,500 to 2,000° C. (S3), to provide a yttria sintered body A containing silicon nitride within a range of 5 to 40% by volume, thereby allowing for an enhanced mechanical strength without undue loss of corrosion resistance.

At the step S1 of the manufacturing method of yttria sintered body, the raw powder is prepared by mixing an amount of yttria powder as a principal ingredient, and an amount of silicon nitride powder weighed to be within the above-noted range. Preferably, the amount of silicon nitride powder should be within a range of 20 to 30% by volume. The raw powder may preferably have alumina, silica, zirconia, silicon carbide, etc. added thereto as a toughening agent or a sintering additive. Those contents of raw powder, other than yttria and silicon nitride, may preferably have a total capacity thereof limited within a range of 5% by volume, while the yttria powder may preferably have an average particle size within a range of 0.01-3.0 μm, and the silicon nitride powder may preferably have an average particle size within a range of 0.01-5.0 μm.

At the step S2, the raw powder thus obtained has binder, water, dispersing agent, etc. added thereto, and they are mixed, thereby preparing a slurry. The slurry thus obtained is granulated by an atomization agglomeration process or the like, into granulated powder, which is heated at 500° C. in air for degreasing. The granulated powder after degreasing is formed into a compact, such as by a die pressing, a CIP (cold isostatic pressing), or a slip casting method.

At the step S3, the compact thus obtained is sintered at temperatures within a range of 1500-2000° C. in an inert gas atmosphere. Sintering temperatures under 1500° C. cause an insufficiently dense yttria sintered body with a low mechanical strength and corrosion resistance, and those over 2000° C. cause a low mechanical strength due to grain growth. The sintering temperature may preferably range within 1700-1900° C., to provide a yttria sintered body with an enhanced mechanical strength. The inert gas may well be nitrogen or argon. The method of sintering is not limited, and may well be a hot press method, to render the yttria sintered body more dense, allowing for an enhanced mechanical strength, corrosion resistance, and high volume resistivity.

Within the manufacturing conditions described, average particle size and composition of the raw powder, sintering temperature, time, and method, and the like may well be controlled, for adequate control (such as of composition, relative density, open porosity, and average grain size) of yttria sintered body containing 5 to 40% by volume of silicon nitride, as necessary to thereby adjust mechanical properties (such as flexural strength and fracture toughness), electrical properties (such as volume resistivity and specific inductive capacity), etc. of a resultant yttria sintered body.

(Ceramic Member)

A yttria sintered body according to the embodiment of the invention is used for a ceramic member needing high corrosion resistance and mechanical strength, and has applications to an electrostatic chuck, a heater, and a susceptor, as will be described.

A ceramic member according to an embodiment of the invention has a metallic member buried in a base body thereof, and a terminal disposed in position for connection of a power supply member (e.g. power feeder or cable) to the metallic member. The terminal may be provided with a connecting member for interconnection with the metallic member. The connecting member may preferably have a joint face preferably at a distance of 1 min or more from a joint face of the metallic member to be connected thereto. Such a distance serves for reinforcement of the ceramic member to provide an enhanced mechanical strength.

The base body may preferably be made, in part, of a "yttria sintered body comprising yttria as a principal component, and 5 to 40% by volume of silicon nitride, according to an embodiment of the invention" (hereinafter sometimes called "toughened yttria sintered body"), and have a metallic member buried in the base body. Or otherwise, the ceramic member may preferably be made: entirely of a toughened yttria sintered body; or made, in part, of a toughened yttria sintered body, and at the rest, of another kind of toughened yttria sintered body, another kind of ceramic sintered body, a metal, or a composite material of ceramic and metal. More specifically, the base body to be formed with a hole for insertion of a terminal may preferably be made of a toughened yttria sintered body, at a part thereof in a vicinity of the terminal insertion hole, where the ceramic member otherwise might have a low strength, so that the part can be reinforced with a connecting member, allowing for an enhanced mechanical strength of the ceramic member. Such a use of toughened yttria sintered body allows for an enhanced mechanical strength without undue loss of corrosion resistance of the ceramic member.

Description is now made of ceramic members employing a yttria sintered body according to embodiments of the invention.

(Electrostatic Chuck)

Figure 2A:
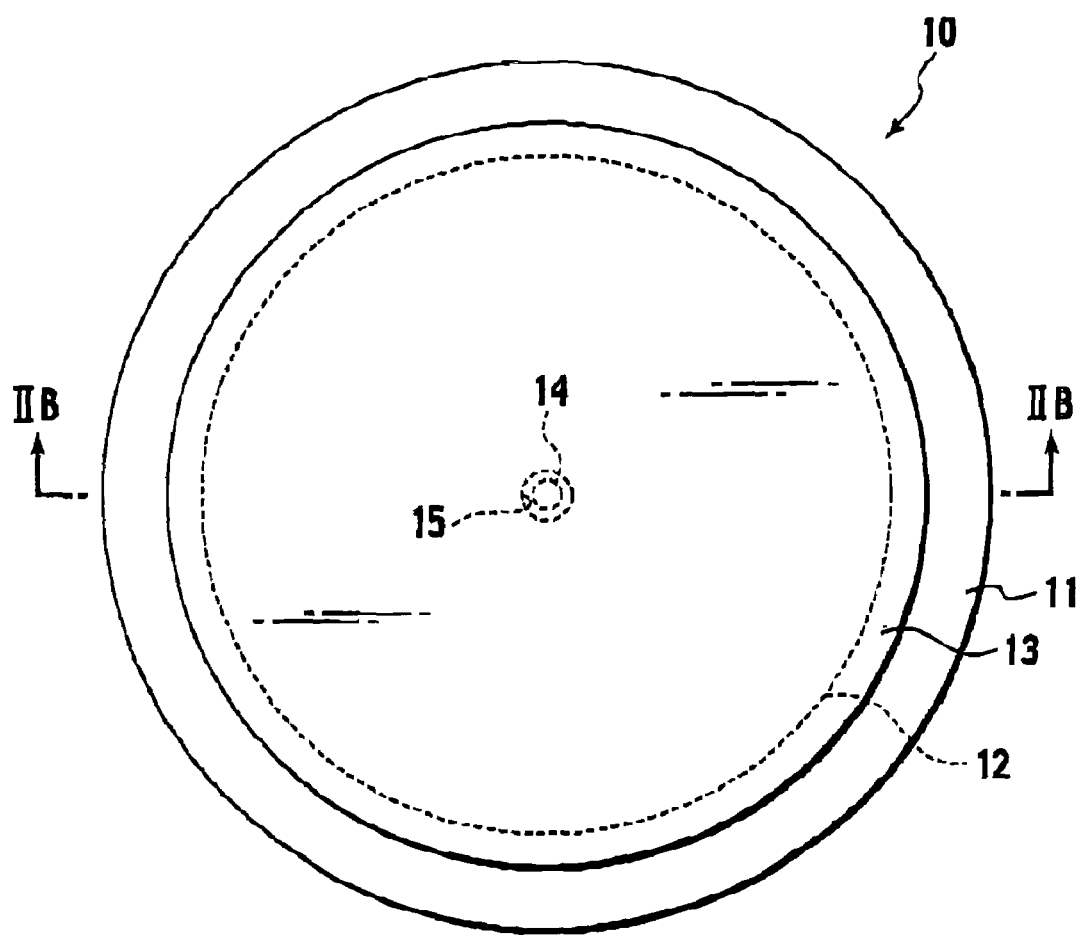
FIG. 2A is a plan of an electrostatic chuck according to an embodiment of the invention.
Figure 2B:
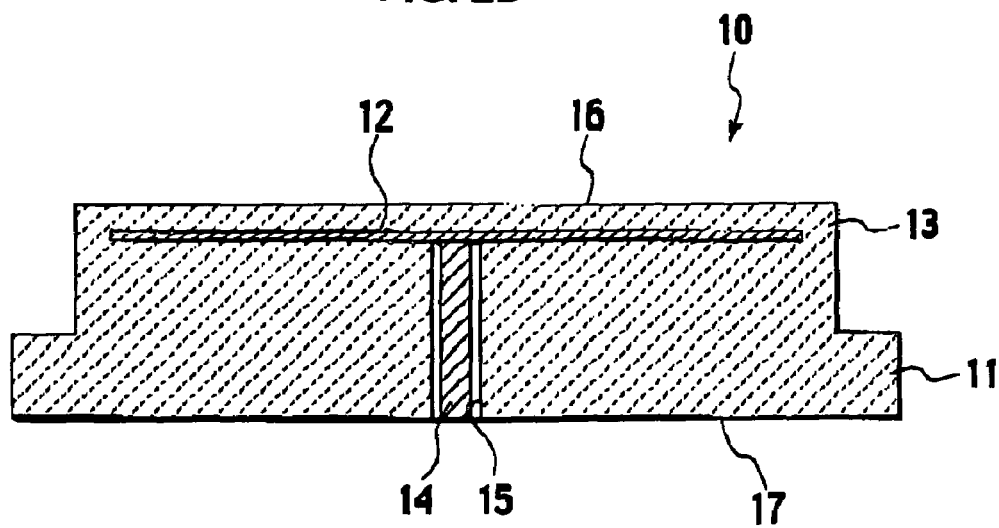
FIG. 2B is a IIB-IIB section of FIG. 2A.

FIG. 2A is a plan of an electrostatic chuck 10 according to an embodiment of the invention, and FIG. 2B is a IIB-IIB section of FIG. 2A. The electrostatic chuck 10 is configured with a base body 11, an electrostatic electrode 12 formed on the base body 11, for generation of electrostatic chucking forces, a dielectric layer 13 formed on the electrostatic electrode 12, and a terminal 14. The electrostatic chuck 10 adsorbs, thereby holding, a substrate (for example, a semiconductor substrate or liquid crystal substrate) placed or superimposed on a substrate mounting side 16.

One of or both the base body 11 and the dielectric layer 13 can be made of a toughened yttria sintered body. If the two are so made, they have identical coefficients of thermal expansion with no difference, allowing for an enhanced joint strength and a suppressed warp after sintering, with a resultant enhancement in uniformity of thickness (the distribution over a side) of the dielectric layer 13.

The base body 11 and the dielectric layer 13 may well be made of a toughened yttria sintered body which has high corrosion resistance and high mechanical strength, for an enhanced corrosion resistance and mechanical strength of the electrostatic chuck, and the dielectric layer 13 may well be made of a toughened yttria sintered body which has high volume resistivity, for an enhanced dechucking response of substrate and an enhanced chucking force in a coulomb type electrostatic chuck, which is an electrostatic chuck that employs, for electrostatic chucking force, coulomb forces developed between the electrostatic electrode 12 and a substrate placed on a substrate mounting side 16 of the dielectric layer 13.

Preferably, the base body 11 as made of a toughened yttria sintered body should be combined with the dielectric layer 13 as made of a "yttria sintered body having a purity of 99.9% by weight or more and a specific inductive capacity of 10 or more" (hereinafter called "high permittivity yttria sintered body"). The base body 11 and the dielectric layer 13, both made of yttria sintered body, can have an enhanced joint strength in between. The base body 11, which is made of a toughened yttria sintered body, allows for an electrostatic chuck having a very high corrosion resistance and high mechanical strength. The dielectric layer 13, which is made of a high-permittivity yttria sintered body which is high of purity and specific inductive capacity, allows the dielectric layer 13 to have an enhanced corrosion resistance, enabling a coulomb type electrostatic chuck to have an enhanced chucking force and dechucking response of substrate.

The high-permittivity yttria sintered body may preferably have a specific inductive capacity of 11.5 or more, a relative density of 98% or more, and an open porosity of 1% or less, thereby allowing the dielectric layer 13 to have a high volume resistivity and high mechanical strength. The high-permittivity yttria sintered body may preferably contain alumina, silica, zirconia, silicon carbide, etc., as a toughening agent or sintering additive, subject to the content to be controlled below 0.1% by volume.

The base body 11 may preferably be made of a sintered body of any other ceramics than yttria, a metal, a composite of ceramics and metal, or the like, providing that the dielectric layer 13 is made of a toughened yttria sintered body. Then, the dielectric layer 13 made of a toughened yttria sintered body allows for an enhanced corrosion resistance and mechanical strength. In addition, the dielectric layer 13 made of a toughened yttria sintered body to be high volume resistivity, allows a coulomb type electrostatic chuck to have an enhanced chucking force and dechucking response of substrate.

In this case, preferably, the base body 11 should be made of a sintered body including alumina, whereby the base body 11 has a coefficient of thermal expansion approximated to that of the dielectric layer 13, so that they have an enhanced chemical compatibility, allowing for an enhanced joint strength in between. In addition, the sintered body including alumina to be high mechanical strength allows for an enhanced mechanical strength of an entirety of the electrostatic chuck. The base body 11 may be made of, for example, an alumina sintered body, a sintered body including alumina and zirconia, a sintered body including alumina and magnesia (MgO), or a sintered body including alumina and silica. The sintered body of the base body 11 may preferably have a relative density of 98% or more. The base body 11 may preferably have a four-point flexural strength at room temperature within a range of 300 MPa or more.

In the case of a combination of base body 11 and dielectric layer 13 made either of a toughened yttria sintered body, and the other of a suitable material other than toughened yttria sintered body, the base body 11 and the dielectric layer 13 may preferably have their coefficients of thermal expansion (CTE) different from each other within a range of $0.50 \times 10^{-6}/°K$ or less, as the difference is measured within a temperature range between room temperature and 1200° C. This provides a yet enhanced joint strength between base body 11 and dielectric layer 13. The difference of coefficient of thermal expansion between base body 11 and dielectric layer 13 may preferably be limited to $0.20 \times 10^{-6}/°K$ or less.

Although at least one of the base body 11 and the dielectric layer 13 can be made of a toughened yttria sintered body, as described, the dielectric layer 13 may preferably be made of a toughened yttria sintered body or a yttria sintered body else. The dielectric layer 13 to be exposed to a corrosive environment is thereby enabled to have an enhanced corrosion resistance, with a resultant suppression of surface corrosion, thus allowing for prevented deteriorations of chucking force and uniformity in temperature distribution of an electrostatic chuck that otherwise might have been caused by irregularities of the substrate mounting side 16 due to surface corrosion.

In any combination described, the dielectric layer 13 may preferably have a volume resistivity of $1 \times 10^{15} \Omega \cdot cm$ or more at room temperature, allowing for an enhanced chucking force and dechucking response. More preferably, the dielectric layer 13 should have a volume resistivity of $1 \times 10^{16} \Omega \cdot cm$ or more at room temperature. The dielectric layer 13 may preferably have a specific inductive capacity of 10 or more, and more preferably, 11.5 or more. The dielectric layer 13 may preferably have a thickness within a range of 0.2 to 0.5 mm, thereby allowing for an enhanced chucking force and dechucking response. More preferably, the dielectric layer 13 should have a thickness within a range of 0.2 to 0.4 mm.

The substrate mounting side 16 of dielectric layer 13 may preferably be finished by a centerline average surface roughness (Ra) of 0.6 μm or less (to JISB0601), allowing for a sufficient chucking force and suppressing particle generation due to low friction between of the substrate mounting side 16 and a substrate. More preferably, centerline average surface roughness should be 0.4 µm or less.

In the electrostatic chuck 10, the electrostatic electrode 12 is buried in position between the base body 11 and the dielectric layer 13, for generation of electrostatic chucking forces with electric power supplied. The electrostatic electrode 12 may preferably be made of a material which is high of m.p. (melting point), for example, a high-m.p. material having an m.p. of 1,650° C. or more. The electrostatic electrode 12 may preferably be made of a material higher of coefficient of thermal expansion, by $5 \times 10^{-6}/°$ K or less, than the base body 11 and the dielectric layer 13, thus allowing for an enhanced adhesion of electrostatic electrode 12 to base body 11 and dielectric layer 13.

More specifically, the electrostatic electrode 12 may well employ a high-m.p. material containing at least one of molybdenum (Mo), tungsten (W), molybdenum carbide (MoC), tungsten carbide (WC), tungsten-molybdenum alloy, hafnium (Hf), titanium (Ti) tantalum (Ta), rhodium (Rh), rhenium (Re), platinum (Pt) and niobium (Nb) can be used as electrode 12.

The electrostatic electrode 12 may have an arbitrary configuration, e.g., such one that contains high-m.p. material powder and has a print pasts printed thereon, or such one that employs a CVD (chemical vapor deposition) or PVD (physical vapor deposition) layer or a bulk of high-m.p. material. The electrostatic electrode 12 may have an arbitrary form, e.g., a circular form, a semicircular form, a mesh-shaped (metallic net) form, a comb-toothed form, or a porous (punched metal) form. The electrostatic electrode 12 may be a mono-polar type, a bi-polar type, or a multi-polar type having a greater number of poles than two.

The base body 11 has a terminal insertion hole 15 formed in a bottom side 17 thereof (the opposite side to the substrate mounting side 16), for insertion of the terminal 14. This hole 15 extends from the bottom side 17 toward the electrostatic electrode 12 to be thereby exposed in part. The terminal 14 is joined to the electrostatic electrode 12, by a brazing or welding.

The base body 11, electrostatic electrode 12, and dielectric layer 13 may preferably be fabricated as an integrally sintered body, for all of them to be joined strong, thereby allowing the electrostatic chuck 10 to have an enhanced strength, with a resultant prevention of electrical defaults, such as an arcing. Preferably, the integral sintering should be by a hot press method. The electrostatic chuck 10 may preferably have a thickness (in terms of a distance between the substrate mounting side 16 and the bottom side 17) within a range of 1 to 3 mm, allowing for a reduced thermal resistance contributing to an excellent thermal characteristic of the electrostatic chuck.

(Electric Heater)

Figure 3A:
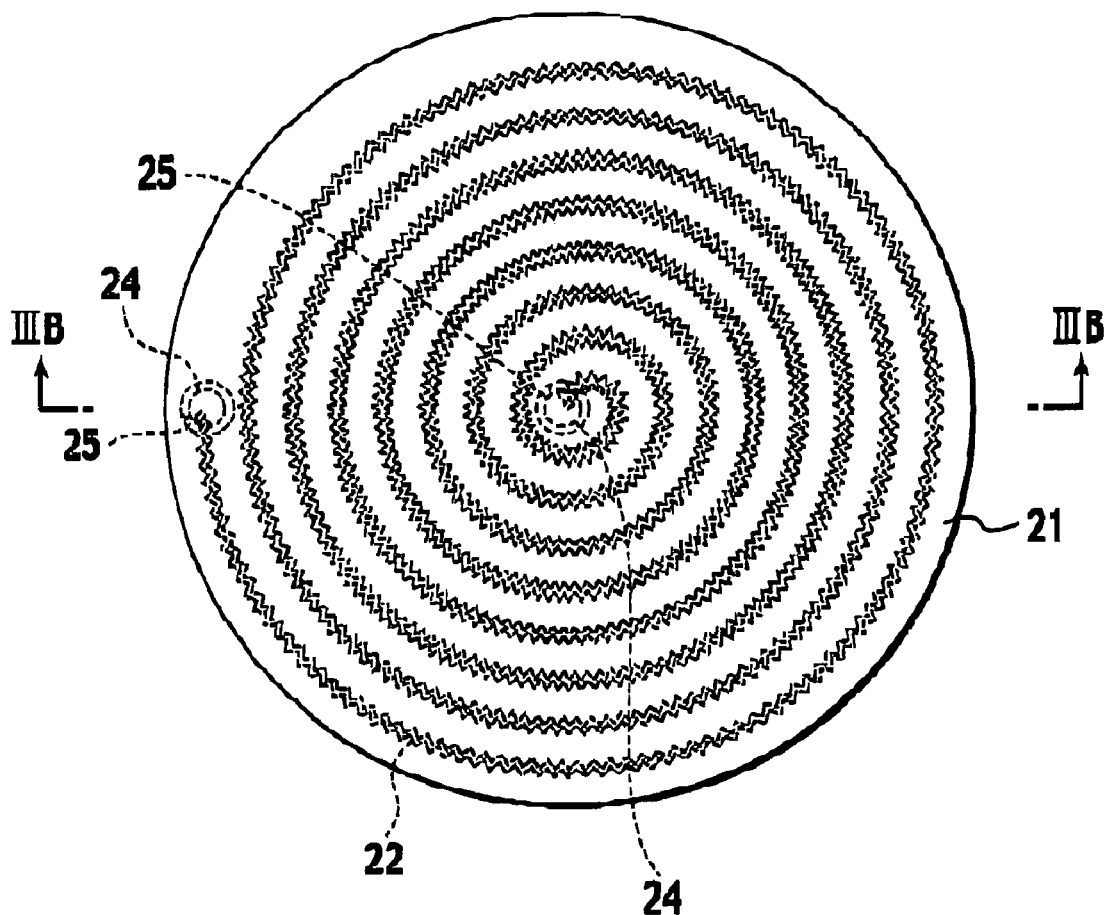
FIG. 3A is a plan of an electric heater according to an embodiment of the invention.
Figure 3B:
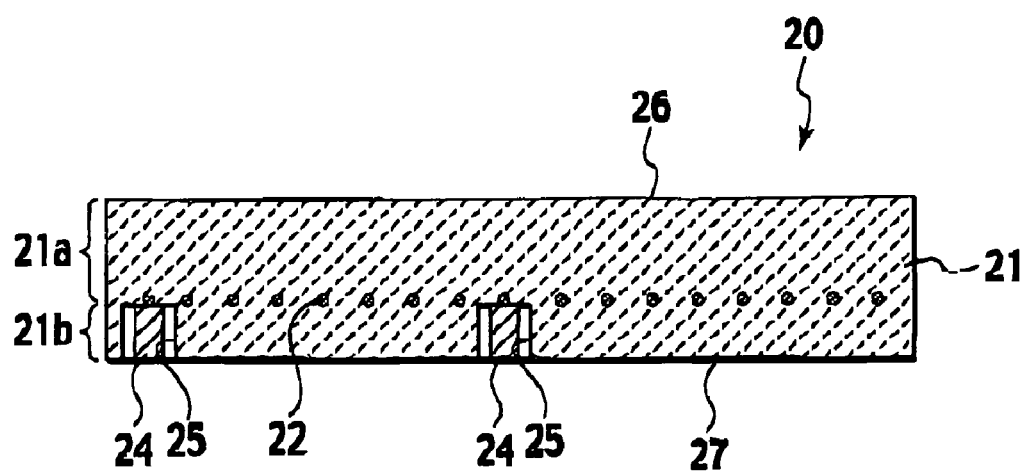

FIG. 3A is a plan of an electric heater 20 according to an embodiment of the invention, and FIG. 3B is a IIIB-IIIB section of FIG. 3A. The electric heater 20 is configured with a base body 21, a resistance heating element 22 buried in the base body 21, and two terminals 24, and is adapted to heat a substrate (e.g. semiconductor substrate or liquid crystal substrate) superimposed on a substrate heating side 26.

The base body 21 may preferably be made, entirely or at least in part, of a toughened yttria sintered body. The base body 21 may preferably be made of a toughened yttria sintered body, at a portion thereof including the substrate heating side 26 or at an upper layer 21a above the resistance heating element 22. The substrate heating side 26 to be exposed to a corrosive environment is thereby enabled to have an enhanced corrosion resistance, with a resultant suppression of surface corrosion, thus allowing for a prevention of such a deterioration of uniformity of thermal distribution in the electric heater 20 that otherwise might have been caused by irregularities of the substrate heating side 26 due to surface corrosion.

The base body 21 may preferably be made, at the upper layer 21a, of a toughened yttria sintered body, and at a lower layer 21b, of a suitable material else, or more specifically, a sintered body of any other ceramics than yttria, a metal, a composite of ceramics and metal. In particular, the lower layer 21b may well be made of a sintered body containing alumina, thereby allowing the upper and lower layers 21a and 21b to have their coefficients of thermal expansion minimized in difference, with a resultant enhancement of joint strength in between, whereby the sintered body containing alumina has an enhanced mechanical strength, allowing for an enhanced mechanical strength of an entirety of the heater 20, as well. The alumina containing sintered body may well be a corresponding material employed in the base body 11 of electrostatic chuck 10. The upper and lower layers 21a and 21b may preferably have their coefficient of thermal expansion different from each other within a range of $0.50 \times 10^{-6}/°$ K or less, or more preferably, within a range of $0.20 \times 10^{-6}/°$ K or less.

The substrate heating side 26 of base body 21 may preferably be finished by a centerline average surface roughness (Ra) of 1.6 µm or less (to JISB0601), allowing an adequate contact of a substrate on the substrate heating side 26 to have good temperature uniformity, and suppressing particle generation due to a friction of the substrate with the substrate heating side 26.

The resistance heating element 22 is adapted, with supplied electric power, for hating a substrate on the substrate heating side 26, and may well be made of an identical high-m.p. (melting point) material to the electrostatic electrode 12. The resistance healing element 22 may preferably be made of a material whose coefficient of thermal expansion is different from the base body 21, by $5 \times 10^{-6}/°$ K or less, allowing for an enhanced adhesion between base body 21 and heating, element 22.

The resistance heating element 22 may have an arbitrary configuration, e.g., an identical form to the electrostatic electrode of FIG. 2A, or a spiral form illustrated in FIG. 3A, or any form else, such as a mesh-shape, perforated-shape (punching metal), or comb-shape, or the like. The resistance heating element 22 may be composed of a single pattern, or a combination of a plurality of divided pattering, e.g., a pair of patterns located in two separate regions, being a central region and a peripheral region of the substrate heating side 26.

The base body 21 has two terminal insertion holes 25 formed in a bottom side 27 thereof (the opposite side to the substrate heating side 26), for insertion of the terminals 24. Each hole 25 is identical in configuration to the terminal insertion hole 15 of the electrostatic chuck 10 shown in FIG. 2B, and is opened in like manner.

The base body 21 and resistance heating element 22 may preferably be fabricated as an integrally sintered body. Preferably, the integral sintering should be by a hot press method.

(Susceptor)

Figure 4:
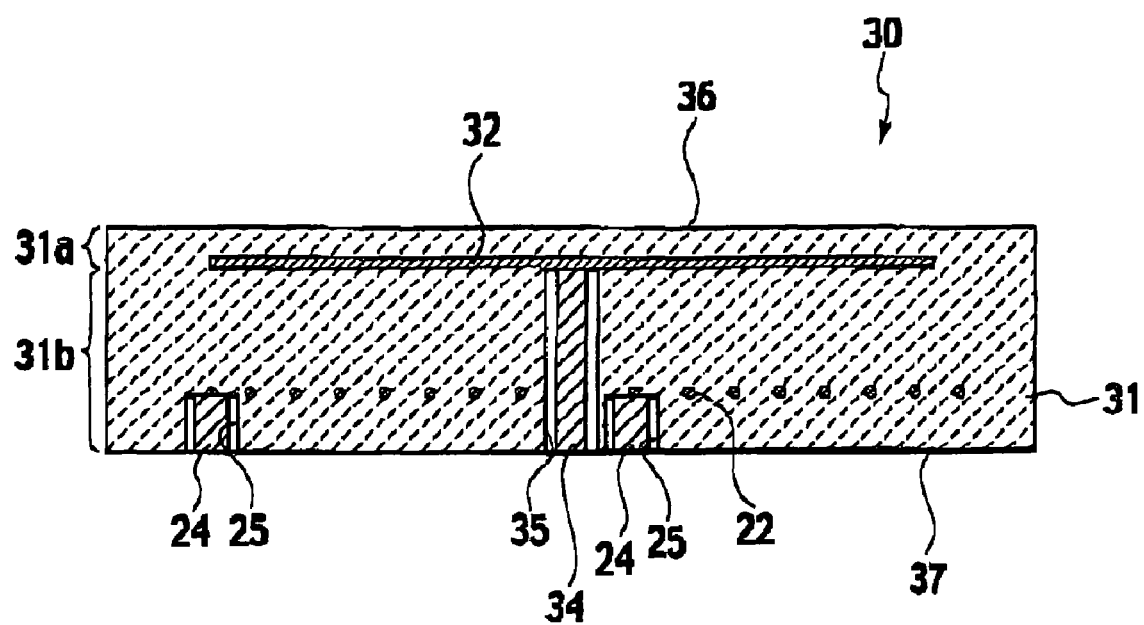
FIG. 4 is a section of a susceptor according to an embodiment of the invention.

FIG. 4 is a section of a susceptor 30 according to an embodiment of the invention. The susceptor 30 has an RF (radio frequency) electrode 32 buried in a base body 31, and a terminal 34 connected to the RF electrode 32, as illustrated in FIG. 4. It further has a resistance heating element 22 buried in the base body 31 and connected at both ends to terminals 24, for adaptation to a required heating, like the electric heater 20 in FIG. 3A and FIG. 3B.

The susceptor 30 is configured with a substrate heating side 36 as a substrate mounting side for a substrate (for example, semiconductor substrate or liquid crystal substrate) to be superimposed and held thereto in an atmosphere of halogen reactant gases (for example, corrosive gas, or insulation film forming gas) excited by the RF electrode 32 for an etching of plasma CVD.

The base body 31 may preferably be made, entirely or at least in part, of a toughened yttria sintered body. The base body 21 may preferably be made of a toughened yttria sintered body, at a portion thereof including the substrate heating side 36 or at an upper layer 31a above the RF electrode 32. The substrate heating side 36 to be exposed to a corrosive environment is thereby enabled to have an enhanced corrosion resistance, with a resultant suppression of surface corrosion, thus allowing for a prevention of such a deterioration of uniformity in thermal distribution of a substrate that otherwise might have been caused by irregularities of the substrate heating side 36 due to surface corrosion. The base body 31 may be a combination of the upper layer 31a made of a toughened yttria sintered body and a lower layer 31b made of a suitable material else, wherefor like method to the electric heater 20 may be employed.

The RF electrode 32 is adapted to excite reactant gases with electric power supplied, and may well be made of like material to the electrostatic electrode 12 of electrostatic chuck 10.

For the terminal 34 to be connected to the RF electrode 32, the base body 31 has, in a bottom side 37 thereof (the opposite side to the substrate mounting side 36), a hole 35 formed for insertion of the terminal 34. The terminal 34 is joined to the RF electrode 32 by a suitable method, e.g. a brazing or welding.

The base body 31, RF electrode 32, and resistance heating element 22 may preferably be fabricated as an integrally sintered body. Preferably, the integral sintering should be by a hot press method.

The susceptor 30 has like configuration to the electric heater 20 of FIG. 3A and FIG. 3B, unless otherwise described.

It is noted that the susceptor 30, which has the resistance heating element 22 buried therein for adaptation to a heating as shown in FIG. 4, may be modified as a susceptor not having a resistance heating element.

It also is noted that the electrostatic chuck 10 shown in FIG. 2 may well have a resistance heating element buried therein for adaptation to a heating.

Further, the electrostatic chuck, heater, and susceptor shown in FIG. 2 to FIG. 4 may well have a connecting member for connection of a terminal 14, 24, or 34 to a metallic member (i.e. electrostatic electrode 12, resistance heating element 22, or RF electrode 32), as exemplified below.

Figure 5A:
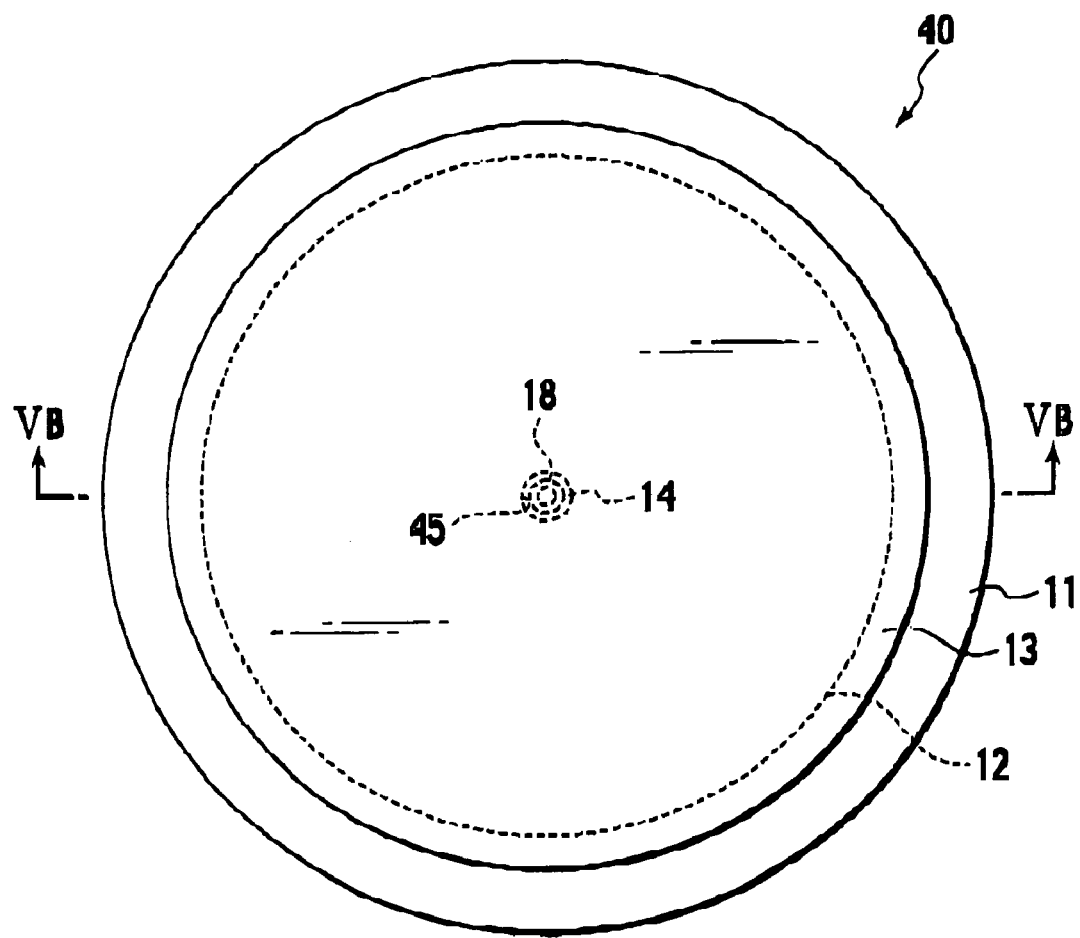
FIG. 5A is a plan of an electrostatic chuck having a connection member buried therein according to an embodiment of the invention.
Figure 5B:
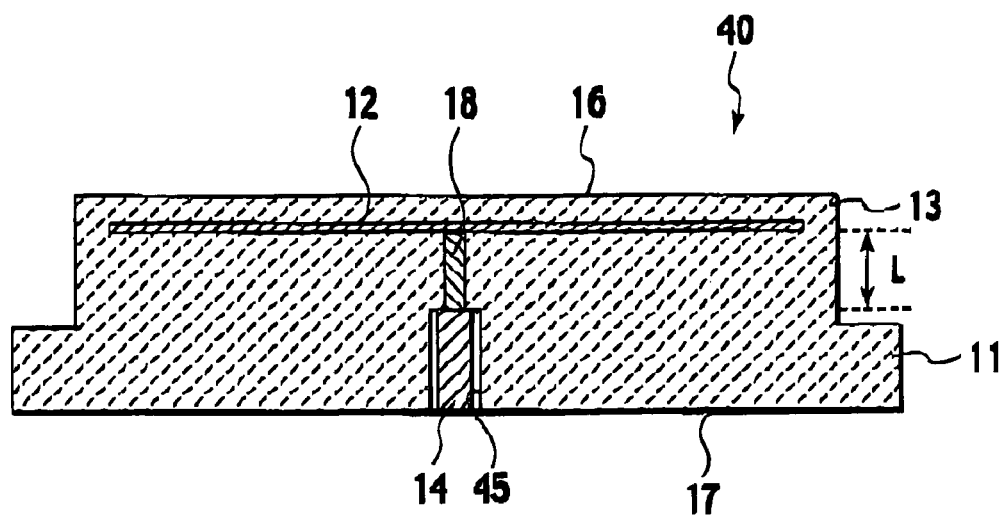
FIG. 5B is a VB-VB section of FIG. 5A.

FIG. 5A is a plan of an electrostatic chuck 40 having a connection member buried therein according to an embodiment of the invention, and FIG. 5B is a VB-VB section of FIG. 5A.

A connecting member 18 is buried in a base body 11. The connecting member 18 is joined at upper and lower ends thereof to an electrostatic electrode 12 and a terminal 14, respectively, for electrical interconnection between the electrostatic electrode 12 and the terminal 14. The connecting member 18 may be made of an identical high-m.p. material to the electrostatic electrode 12. In particular, for base body 11 made of a toughened yttria sintered body or a yttria sintered body containing alumina, the connecting member 18 may preferably made of a material containing niobium (for example, niobium itself or an alloy of niobium and a metal of any suitable kind). The connecting member 18 may well have a coefficient of thermal expansion which is small of difference from that of the base body 11, thereby allowing, even if the connecting member 18 is buried in the base body 11, for suppressed occurrences of cracks, with a resultant prevention of deformation of the connecting member 18, even when heated (e.g. in a sintering) in the manufacturing step. Preferably, the difference of coefficient of thermal expansion between them should be minimized to $3 \times 10^{-6}/°K$ or less, for effective prevention of occurrences of cracks.

The connecting member 18, which is cylindrical in FIG. 5, may have an arbitrary form, e.g., prismatic, tubular, circular, or spherical. The connecting member 18 may well have a length L of 1 mm or more, preferably within a range of 1 to 3 mm, in terms of a distance from a joint face with the electrostatic electrode 12 to that with the terminal 14, to thereby reinforce the electrostatic chuck 40, as necessary for the mechanical strength to be enhanced. The connecting member 18 may well have a diameter within a range of 1 to 5 mm, when formed tubular, circular, or spherical, or a width within a range of 1 to 4 mm, when formed prismatic. The connecting member 18 may be joined to the electrostatic electrode 12 under pressure in a heated condition, for example, by a hot press method. An adhesive may then be interposed between the connecting member 18 and the electrostatic electrode 12. It may be a print paste for formation of electrostatic electrode 12, or any suitable organic adhesive.

The base body it has, in a bottom side 17 thereof (the opposite side to the substrate mounting side 36), a hole 45 formed for insertion of the terminal 14. The hole 45 extends from the bottom side 17 to the connecting member 18 to be thereby exposed in part. The terminal 14 is inserted into the hole 45, and joined to an exposed part of the connecting member 18, by a suitable method, e.g. a brazing or welding. The brazing filler may be an alloy or a composite of metal and ceramics, for example: an alloy filler containing indium (In), gold (Au), silver (Ag), aluminum (Al), nickel (Ni), and titanium (Ti), or aluminum and alumina composite.

The connecting member 18 may be formed with a recess for insertion of the terminal 14. The electrostatic chuck 40 has the hole 45 opened for insertion of the terminal 14, with a tendency to have a reduced strength about the hole 45. However, application of connecting member 18 formed with the recess can contribute for enhancement of mechanical strength of the electrostatic chuck 40. Further, the provision of connecting member 18 enables the distance between the hole 45 and the substrate mounting side 16 to extend commensurately with length L of the connecting member 18. As a result, concerns can be removed about the tendency for strength reduction due to formation of the hole 45, even in an electrostatic chuck of a coulomb type that has a thin dielectric layer 13.

The connecting member 18 may be applied to the electric heater 20 or susceptor 30, as well in application to the heater 20 shown in FIG. 3A and FIG. 3B, the connecting member may be buried in the base body 21, and joined to both resistance heating element 22 and terminal 24, for interconnection therebetween. In application to the susceptor 30 shown in FIG. 4, the connecting member may be buried in the base body 31, and joined to both RF electrode 32 and terminal 34, for interconnection therebetween.

The electrostatic chuck, electric heater, and susceptor may preferably be each respectively fabricated as an integrally sintered body (hereinafter sometimes called "integral sintered body"). Preferably, the integral sintering should be by a hot press method.

More specifically, for electrostatic chuck, the base body 11, electrostatic electrode 12, and dielectric layer 13 may be integrally fabricated together with a suitable connecting member, as an integral sintered body. For electric heater, the base body 21 and the resistance heating element 22 may be integrally fabricated together with suitable connecting members, as an integral sintered body. For susceptor, the base body 31, the RF electrode, and the resistance heating element 22 may be integrally fabricated together with suitable connecting members, as an integral sintered body. Such an integration allows for a strong joint among base body 11, 21, or 31, metallic member(s) (electrostatic electrode 12, resistance heating element 22, and/or RF electrode 32), and (a) connecting member(s).

(Manufacturing Method of Ceramic Member)

Description is now made of a manufacturing method of ceramic member according to an embodiment of the invention, taking the electrostatic chuck 10 as an example of ceramic member. It is noted that the electrostatic chuck 10 is made of toughened yttria sintered body, at the base body 11 and at the dielectric layer 13.

First, a body of toughened yttria sintered body is fabricated in accordance with the manufacturing method of yttria sintered body described, to be taken as a base body 11. Then, on the base body 11 is printed, by a screen printing method, a required quantity of print paste to form an electrostatic electrode 12. Preferably, the print paste should be a mixture between powder of a high-m.p. material and powder of an identical ceramics to a ceramics to be contained in the base body 11 or dielectric layer 13 or an approximate ceramics that has a coefficient of thermal expansion close to that of the identical ceramics, thereby enabling the electrostatic electrode 12 to have a coefficient of thermal expansion which is small or minimized of differences to those of the base body 11 and dielectric layer 13, thus allowing for an enhanced joint strength in between. The print paste may preferably contain ceramics powder within a range of 5 to 30% by weight. The base body 11 may have a bulk of high-m.p. material placed on a surface, or a thin film of high-m.p. material formed thereon by CVD or PVD, to thereby form the electrostatic electrode 12.

Next, the electrostatic electrode 12 has a compact formed thereon to thereby provide the dielectric layer 13. That is, in a molding die having the base body 11 formed with the electrostatic electrode 12 and set therein, there is filled over the electrode 12 a necessary amount of granules prepared and granulated in an identical manner to the base body 11, for formation of the compact to constitute the dielectric layer 13. A compact formed by use of granulated granules, such as by a die pressing, CIP, or slipping cast method, may be placed on the base body 11, to be pressed for formation of the compact constituting the dielectric layer 13.

Finally, an entirety of combination of the base body 11, the electrostatic electrode 12 thereon, and the compact thereover is in integrally sintered for formation of an integral sintered body, such as by a hot press method, thereby forming the dielectric layer 13 made of a toughened yttria sintered body. More specifically, under pressure in the direction of an axis, associated sintering conditions (sintering atmosphere, and sintering temperature) are controlled, as necessary for manufacture of the toughened yttria sintered body. The pressure may preferably be controlled within a range of 50 to 300 kgf/cm$^2$, to obtain a dense toughened yttria sintered body, and more preferably, within a range of 100 to 200 kgf/cm$^2$.

It will be seen that the base body 11, electrostatic electrode 12, and dielectric layer 13 can be formed in an arbitrary order. A dielectric layer 13 of toughened yttria sintered body may be formed first, and followed by formation of an electrostatic electrode 12 on the dielectric layer 13, and formation of a compact to constitute a base body 11 on the electrostatic electrode 12 on dielectric layer 13, before a final integral sintering of them forming the base body 11 made of toughened yttria sintered body. Or alternately, formation of base-body 11 or dielectric layer 13 made of a toughened yttria sintered body may be followed by formation of electrostatic electrode 12 on the sintered body, thereby suppressing a deformation or positional deviation of the electrostatic electrode 12 due to sintering shrinkage, thus rendering the electrode 12 flat, with a resultant enhancement in uniformity of chucking force or uniformity of thermal distribution of the electrostatic chuck 10. The base body 11 or the dielectric layer 13 may be formed as a toughened yttria calcined body, before formation of the electrostatic electrode 12 on the calcined body, to achieve a similar effect. For formation of the toughened yttria calcined body, the calcining may preferably be performed within a lower temperature range, e.g. a calcining temperature range of 1300 to 1600° C., than that of toughened yttria sintered body, and for a shorter sintering time than that of toughened yttria sintered body. Formation of a lamination of a compact for a base body 11, an electrostatic electrode 12, and a compact for a dielectric layer 13 may be followed by an integral sintering of the lamination by a hot press method, as a manner of course.

Then, the integral sintered body is ground, lapped and/or polished to establish a thickness of dielectric layer 13, a centerline average surface roughness (Ra) of substrate mounting side 16, and a total thickness of electrostatic chuck 10, as specified. The base body 11 is drilled to form a hole 15 for terminal insertion, and a terminal 14 is inserted into the hole 15, and brazed or welded to the electrostatic electrode 12.

For formation of the base body 11 of all alumina-containing sintered body, a corresponding raw material powder is prepared (for example, simply of alumina powder, a mixture of alumina powder and zirconia powder, a mixture of alumina powder and magnesia powder, or a mixture of alumina powder and silica powder), for preparation of a slurry. Then, the compact is sintered in an inert gas atmosphere (e.g., nitrogen gas or argon gas) by a hot press method or normal-pressure sintering method, within a temperature range of 1,500 to 1,700° C. For electrostatic chuck 10, the manufacture proceeds like the case that employs the base body 11 of a toughened yttria sintered body, unless otherwise described.

For formation of the dielectric layer 13 of a high-permittivity yttria sintered body, a corresponding raw material powder is prepared (for example, simply of yttria powder, or a mixture of yttria powder with alumina powder, silica powder, zirconia powder, or silicon carbide powder added as a toughening agent or a sintering additive), for preparation of a slurry. Then, the compact is sintered in an inert gas atmosphere (e.g., nitrogen gas or argon gas), within a temperature range of 1,500 to 1,800° C. The high-permittivity yttria sintered body may preferably have its purity adjusted to 99.9% by weight or more, by changing composition of the raw material powder, and/or its specific inductive capacity adjusted to 10 or more, by changing the sintering condition. For electrostatic chuck 10, the manufacture proceeds like the case that employs the dielectric layer 13 of a toughened yttria sintered body, unless otherwise described.

Also for the electric heater 20 or susceptor 30, the manufacture may well proceed like that of electrostatic chuck 10. First, like the base body 11, a lower layer 21b or 31b of a toughened yttria sintered body is formed. For the lower layer 31b, for example, a compact may be formed with a resistance heating element 22 buried therein, then sintered. On the lower layer 21b or 31b, there is formed a resistance heating element 22 or RF electrode 32, respectively, like the electrostatic electrode 12. Next, over the resistance heating element 22 or RF electrode 32 on lower layer 21b or 31b, there is formed a compact to constitute an upper layer 21a or 31a, respectively, like the dielectric layer 13. Then, an entirety of combination of the lower layer 21b or 31b, the resistance hearing element 22 or RF electrode 32 thereon, and the compact thereover is integrally sintered for formation of an integral sintered body, such as by a hot press method, thereby making the upper layer 21a or 31a of a toughened yttria sintered body, whereby a base body 21 or 31 is respectively made.

It will be seen that, like the case of electrostatic chuck 10, the lower layer 21b or 31b, resistance heating element 22 or RF electrode 32, and upper layer 21a or 31a can be respectively formed in an arbitrary order. An upper layer 21a or 31a of toughened yttria sintered body may be formed first, and followed by formation of a resistance heating element 22 or RF electrode 32 on the upper layer 21a or 31a, respectively. Thus, formation of upper layer 21a or 31a or lower layer 21b or 31b made of a toughened yttria sintered body may be followed by formation of resistance heating element 22 or RF electrode 32 on the sintered body, thereby suppressing a deformation or positional deviation of the resistance heating element 22 or RF electrode 32 due to sintering shrinkage, thus rendering the resistance heating element 22 or RF electrode 32 flat, with a resultant enhancement in uniformity of thermal distribution of the electric heater 20 or in homogeneity of plasma of the susceptor 30, respectively.

It is noted that, like the case of electrostatic chuck 10, the upper layer 21a or 31a or lower layer 21b or 31b may be formed as a toughened yttria calcined body, before formation of the resistance heating element 22 or RF electrode 32 on the calcined body, to achieve a similar effect. Formation of a lamination of a compact for an upper layer 21a or 31a, a resistance heating element 22 or RF electrode 32, and a compact for a lower layer 21b or 31b may be followed by an integral. Wintering of the lamination by a hot press method to make a base body 21 or 31, respectively, as a matter of course. For formation of the base body 11 of an alumina-containing sintered body, the manufacture may proceed like the case of electrostatic chuck 10.

Then, the integral sintered body is ground, lapped and/or polished to establish a centerline average surface roughness (Ra) of substrate heating side 26 or substrate mounting side 36, and a total thickness of electric heater 20 or susceptor 30, as specified. The base body 21 or 31 is drilled to form a hole 25 or 35 for terminal insertion, and a terminal 24 or 34 is inserted into the hole 25 or 35, and brazed or welded to the resistance heating element 22 or RF electrode 32.

For manufacture of the electrostatic chuck 40 provided with the connecting member 18, as illustrated in FIG. 5, or of an electric heater or susceptor likewise provided with a connecting member, a metallic member (e.g. electrostatic electrode 12, resistance heating element 22, or RF electrode 32) formed on a sintered or calcined body for dielectric layer 13 or upper layer 21a or 31a has the connecting member disposed in contact therewith, and then a compact formed to constitute base body 11 or lower layer 21b or 31b over the metallic with connecting member on the sintered or calcined body, to be integrally sintered by a hot press method, to obtain a base body 11, 21, or 31, where the connecting member is joined to the metallic member and buried in the base body. For this manufacture, an adhesive may be applied between the connecting member and the metallic member (electrostatic electrode 12, resistance heating element 22, or RF electrode 32). In this case, formation of electrostatic electrode 12 by a screen printing method on the dielectric layer 13 may be followed by use of a positioning jig to determine a location for formation of the connecting member 18. To the location for formation on the electrostatic electrode 12, the connecting member 18 is adhered by a print paste as the adhesive. Next, in a molding die having the dielectric layer 13 formed with electrostatic electrode 12 and connecting member 18 and set in the die, there is filled a necessary amount of granules granulated for base body 11, to be pressed into a compact, then an integral sintering is performed by a hot press method to make a ceramic member. Formation of a lamination of a compact for a dielectric layer 13 or upper layer 21a or 31a, a metallic member (i.e. electrostatic electrode 12, resistance heating element 22, or RF electrode 32) having a connecting member in contact therewith, and a compact for a based body portion or lower layer 21b or 31b may be followed by an integral sintering of the lamination by a hot press method to make a base body 11, 21, or 31 that has the connecting member joined to the metallic member and buried in the base body.

Then, the base body 11, 21, or 31 is drilled to form a hole for terminal insertion, into a required depth for exposure of the connecting member, and a terminal 14, 24, or 34 is inserted into the hole 21 or 35, and brazed or welded to the connecting member. For other respects, the manufacture proceeds like that of the electrostatic chuck 10, electric heater 20, or susceptor 30 to be provided with no connecting member.

For formation of a base body 11 or lower layer 21b or 31b made of a material else than ceramics described, an adhesive may be applied between the base body 11 or lower layer 21b or 31b (of a metal or a composite of metal and ceramics), a metallic member (electrostatic electrode 12, resistance heating element 22, or RF electrode 32), and a dielectric layer 13 or lower layer 21a or 31a made of a toughened yttria sintered body.

According to the embodiments described, the yttria sintered body contains 5 to 40% by volume of silicon nitride, allowing for an enhanced mechanical strength without undue loss of corrosion resistance. Therefore, a ceramic member (electrostatic chuck 10, 40, electric heater 20, or susceptor 30) formed with a toughened yttria sintered body has an enhanced corrosion resistance not only to corrosive halogen gases (such as nitrogen fluoride ($NF_3$)), but also to plasma corrosive gases. In addition, the ceramic member has a sufficient corrosion resistance even to an In-situ cleaning in a etching process, and has wide applications to the electrostatic chuck, electric heater, and susceptor, as well as to the industries for manufacture of semiconductor and liquid crystal.

Moreover, the ceramic member has a high mechanical strength, so that occurrences of cracks or chipping can be prevented in their processing. Further, the ceramic member can be prevented against cracks due to thermal stresses, even in joining of terminal 14, 24, or 34 by a brazing or welding to the metallic member (electrostatic electrode 12, resistance heating element 22, or RF electrode 32).

EXAMPLES

There will be detailed examples of the embodiments, while the invention is not limited thereto.
(Yttria Sintered Body)

Examples 1-9 and Comparison Examples 1-3

For powder preparation of yttria and silicon nitride, yttria powder and silicon nitride powder were weighed, and mixed by composition ratios shown in Table 1, to provide a raw material powder. Particle size of yttria powder was 1 μm in average, and that of silicon nitride powder, 0.5 μm in average. Water, a dispersing agent, and polyvinyl alcohol (PVA) as a binder were added to the raw material powder, and mixed therewith by a trommel, to provide a slurry. The slurry was atomized and dried by a spray dryer, and granulated into granules, which were degreased by heating at 500° C. in air. Degreased granules were filled in a molding die, where they were pressed in the direction of a single axis to form a compact. The compact was accommodated in a carbon mold, and sintered by a hot press method at a sintering temperature shown in Table 1, to provide a yttria sintered body of a size of 350 mm diameter by 6 mm thickness.

Of the yttria sintered body thus obtained, seven evaluations (1) to (7) were made, as follows. Evaluation (1): an average grain size of silicon nitride included in the yttria sintered body was measured by a scanning electron microscope (SEM). More specifically, by using the scanning electron microscope, a photograph was taken by a magnification allowing for a measurement of size of silicon nitride grains (e.g. within a range of magnification factors of 2,000 to 100,000), wherefrom short diameters of 100 silicon nitride grains were measured to determine an average grain size. Evaluation (2): using pure water as a medium, a relative density was measured by an Archimedes method. Evaluation (3): a four point bending or flexural strength at room temperature was measured (to JIS R1601). Evaluation (4): a fracture toughness was measured (to JIS R1607). Evaluation (5): the yttria sintered body was masked in part, and subjected to a corrosion resistance test for five hours in a gaseous mixture of $NF_3$ and oxygen, under a pressure of 0.1Torr, with a plasma source power of 800 W and a bias power of 300 W. Of the yttria sintered body after the corrosion resistance test, a step defined between the masked part and a non-masked part was measured, and assumed to be an amount of corrosion loss for evaluation of corrosion resistance. Evaluation (6): a volume resistivity was measured at room temperature and 150° C. (to JIS C2141). Applied voltage was 2000V/mm. Evaluation (7): a specific inductive capacity was measured (to JIS C2141). Results are shown in Table

TABLE 1

|  |  | Ex. 1 | Ex. 2 | Ex. 3 | Ex. 4 | Ex. 5 | Ex. 6 | Ex. 7 | Ex. 8 | Ex. 9 | Com. Ex. 1 | Com. Ex. 2 | Com. Ex. 3 |
|---|---|---|---|---|---|---|---|---|---|---|---|---|---|
| Composition Ratio [volume %] | Yttria | 95 | 90 | 80 | 70 | 70 | 70 | 70 | 70 | 60 | 100 | 100 | 50 |
|  | Silicon nitride | 5 | 10 | 20 | 30 | 30 | 30 | 30 | 30 | 40 | 0 | 0 | 50 |
| Composition Ratio [weight %] | Yttria | 97 | 93 | 86 | 78 | 78 | 78 | 78 | 78 | 70 | 100 | 100 | 61 |
|  | Silicon nitride | 3 | 7 | 14 | 22 | 22 | 22 | 22 | 22 | 30 | 0 | 0 | 39 |
| Sintering Temperature [° C.] |  | 1800 | 1800 | 1900 | 1900 | 1600 | 1900 | 1900 | 1900 | 1900 | 1600 | 1800 | 1900 |
| Average grain size of silicon nitride [μm] |  | 0.5 | 0.5 | 0.5 | 0.5 | 0.5 | 1.2 | 3.0 | 6.4 | 0.5 | — | — | — |
| Relative Density [%] |  | >99% | >99% | >99% | >99% | 97% | >99% | >99% | >99% | >99% | >99% | >99% | >99% |
| Four point flexural strength [MPa] |  | 185 | 205 | 250 | 300 | 180 | 280 | 250 | 170 | 340 | 140 | 120 | 360 |
| Fracture Toughness [MPa·m$^{1/2}$] |  | 1.4 | 1.5 | 1.8 | 2.3 | 1.5 | 2.5 | 2.6 | 2.0 | 2.8 | 1.0 | 1.1 | 3.3 |
| Amount of corrosion loss [μm] |  | 0.7 | 0.9 | 1.1 | 1.3 | 1.9 | 1.3 | 1.3 | 1.4 | 2.1 | 0.6 | 0.6 | 6.2 |
| Volume Resistivity [Ω·cm] | Room Temperature | $1 \times 10^{15}$ | $1 \times 10^{16}$ | $1 \times 10^{16}$ | $1 \times 10^{16}$ | $1 \times 10^{15}$ | $1 \times 10^{16}$ | $1 \times 10^{15}$ | $1 \times 10^{16}$ | $1 \times 10^{16}$ | $1 \times 10^{16}$ | $1 \times 10^{15}$ | — |
|  | 150 [° C.] | $1 \times 10^{15}$ | $1 \times 10^{15}$ | $1 \times 10^{15}$ | $1 \times 10^{15}$ | $1 \times 10^{14}$ | $1 \times 10^{15}$ | $1 \times 10^{15}$ | $1 \times 10^{5}$ | $1 \times 10^{16}$ | $1 \times 10^{15}$ | $1 \times 10^{5}$ | — |
| Relative Permittivity |  | 11.6 | 11.5 | 11.2 | 10.8 | 9.5 | 10.8 | 10.8 | 10.8 | 10.5 | 11.7 | 11.7 | — |

The content of silicon nitride was within 5 to 40% by volume and the sintering temperature was within 1,700 to 1,900° C. in examples 1 to 4 and 6 to 9, where resultant yttria sintered body had a very high relative density of 98% or more, to be very dense.

The sintering temperature was as slightly low as 1,600° C. in example 5, even where a resultant yttria sintered body had a high relative density of 97%, to be dense.

In examples 1 to 9, the yttria sintered bodies had four point flexural strengths of 170 MPa or more, and fracture toughnesses of 1.4 MPa·m$^{1/2}$ or more, so that their mechanical strength was enhanced relative to comparison examples 1 and 2, where the the yttria sintered bodies had four point flexural strengths about 120 MPa, and fracture toughnesses about 1 MPa·m$^{1/2}$. In particular, in examples 3-4, 6-7, and 9 (where the sintering temperature was within 1,700 to 1,900° C., the content of silicon nitride was 20% by volume or more, and the average grain size of silicon nitride was within a range of 0.01 to 5.0 μm ), the yttria sintered bodies had four point flexural strengths of 250 MPa or more, and fracture toughnesses about 2 MPa·m$^{1/2}$ so that their mechanical strength was significantly enhanced.

In addition, in examples 1 to 9, the yttria sintered bodies after their corrosion resistance tests were small amount of corrosion loss, and minor of surface corrosion, so that the corrosion resistance could be kept high. In particular, in examples 1 to 8 where the content of silicon nitride was 30% by volume or less, the amount of corrosion loss was suppressed low, allowing for a very high corrosion resistance.

Further, in examples 1 to 9, the yttria sintered bodies had as high volume resistivities as $1 \times 10^{15} \Omega \cdot cm$ or more at room temperature. In particular, in examples 1-4 and 6-9, the yttria sintered bodies had high volume resistivities of $1 \times 10^{15} \Omega \cdot cm$ or more even at 150° C., thus maintaining the volume resistivity high over a wide temperature range. The yttria sintered bodies of examples 1-4 and 6-9 had high values of 10 or more in specific inductive capacity, as well. To the contrary, in comparison example 1 and 2 containing no silicon nitride, the yttria sintered bodies were very inferior in mechanical strength. In comparison example 3 containing 50% by volume of silicon nitride, the yttria sintered body had a very great amount of corrosion loss, relative to examples 1 to 9 containing 40% volume or less of silicon nitride.

(Ceramic Member)

Example 10

An electrostatic chuck 10 was manufactured as illustrated in FIGS. 2A and 2B. First, yttria powder of an average article size of 1 µm and silicon nitride powder of an average article size of 0.5 µm were mixed, by composition ratios of 70% by volume of yttria and 30% by volume of silicon nitride, to provide a raw material powder. Water, a dispersing agent, and polyvinyl alcohol (PVA) as a binder were added to the raw material powder, and mixed therewith by a trommel, to provide a slurry. The slurry was atomized and dried by a spray dryer, and granulated into granules.

Granules were filled in a molding die, where they were pressed in the direction of a single axis to form a compact. The compact was accommodated in a carbon mold, and sintered by a hot press method in a nitrogen atmosphere at a sintering temperature of 1,900° C., to provide a base body 11 of toughened yttria sintered body.

Next, a powder mixture of 80% by weight of tungsten carbide 20% by weight of alumina powder is mixed, and ethyl cellulose is added as a binders to thereby provide a print paste. On the base body 11 of toughened yttria sintered body, an electrostatic electrode 12 of a size of 290 mm diameter by 20 µm thickness was formed by a screen printing method, and dried.

Next, in a molding die, there is set the base body 11 of toughened yttria sintered body formed with the electrostatic electrode 12, whereon granules granulated similar to those in fabrication of the base body were filled, and pressed under a pressure of 200 kgf/cm², to form a compact for a dielectric layer 13.

The base body 11 of toughened yttria sintered body with the electrostatic electrode 12 and the compact were accommodated in a carbon mold, and sintered by a hot press method in a nitrogen atmosphere at a sintering temperature of 1,900° C., to make the dielectric layer 13 of toughened yttria sintered body.

An integral sintered body thus obtained was processed for establishment of a centerline average surface roughness (Ra) of a substrate mounting side 16 to be 0.4 µm, a thickness of the dielectric layer 13 (i.e. a distance between the electrostatic electrode 12 and the substrate mounting side 16) to be 0.4 mm, and a thickness of a manufactured electrostatic chuck 10 (i.e. a distance between the substrate mounting side 16 and a bottom side 17) to be 3 mm. The base body 11 was drilled to form a hole 15 for application of a terminal 14 to be brazed to the electrostatic electrode 12, to manufacture the electrostatic chuck 10 of a coulomb type.

The base body 11 of toughened yttria sintered body did not suffer from occurrences of cracks or chipping due to the drilling. Also the brazing between electrostatic electrode 12 and terminal 14 was free from crack of the base body 11 due to thermal stresses.

Example 11

An electrostatic chuck 40 was manufactured as illustrated in FIGS. 5A and 5B. Water, a dispersing agent, and polyvinyl alcohol (PVA) as a binder were added to a raw material powder of a purity of 99.9% by weight and an average particle size of 1 µm, and mixed therewith by a trommel, to provide a slurry. The slurry was atomized and dried by a spray dryer, and granulated into granules.

Granules were filled in a molding die, where they were pressed in the direction of a single axis to form a compact. The compact was accommodated in a carbon mold, and sintered by a hot press method in a nitrogen atmosphere at a sintering temperature of 1,600° C., to provide a dielectric layer 13 of a high-permittivity yttria sintered body of a relative inductive capacity of 11.7 by a purity of 99.9% by weight or more.

Next, like the case of example 10, a print paste was prepared, and an electrostatic electrode 12 of a size of 290 mm diameter by 20 µm thickness was formed on the dielectric layer 13 of high-permittivity yttria sintered body by a screen printing method, and dried. Then, a positioning jig or the like was used to determine a position for formation of a connecting member 18. Then, to the position for formation on the electrostatic electrode 12, there was adhered, by using the print paste as an adhesive, the connecting member 18 of niobium of a cylindrical form having a 2 mm diameter by 1 mm length size.

Next, in a molding die, there is set the dielectric layer 13 of high-permittivity yttria sintered body formed with the connecting member 18 and the electrostatic electrode 12, whereon granules granulated similar to those in example 10 (except for the composition ratios to be 90% by volume of yttria and 10% by volume of silicon nitride) were filled, and pressed under a pressure of 200 kgf/cm², to form a compact for a base body 11.

Next, the dielectric layer 13 of high-permittivity yttria sintered body with electrostatic electrode 12 and connecting member 18, and the compact were accommodated in a carbon mold, and sintered by a hot press method in a nitrogen atmosphere at a sintering temperature of 1,900° C., to make the base body 11 of toughened yttria sintered body.

An integral sintered body thus obtained was processed for establishment of a centerline average surface roughness (Ra) of a substrate mounting side 16 to be 0.4 µm, a thickness of the dielectric layer 13 (i.e. a distance between the electrostatic electrode 12 and the substrate mounting side 16) to be 0.4 mm, and a thickness of a manufactured electrostatic chuck 10 (i.e. a distance between the substrate mounting side 16 and a bottom side 17) to be 3 mm. The base body 11 was drilled to form a hole 45 for application of a terminal 14 to be brazed to the connecting member 18, to manufacture the electrostatic chuck 40 of a coulomb type.

The base body 11 of toughened yttria sintered body did not suffer from occurrences of cracks or chipping due to the drilling. Also the brazing between connecting member 18 and terminal 14 was free from crack of the dielectric layer 13 or base body 11 due to thermal stresses.

(Evaluation of Chucking Force and Dechucking Response)

For examples 5 and 6, the chucking force and dechucking response of electrostatic chuck were evaluated, as follows. With a probe made of silicon in contact with the substrate mounting side of electrostatic chuck in a vacuum, a voltage was applied between the electrostatic electrode and the probe, so that this probe was fixed by adsorption to the electrostatic chuck. The probe was then pulled up in a direction in which it is to be removed from the substrate mounting side of electrostatic chuck, by a force required therefor, which was measured as an chucking force. Further, by canceling the voltage imposition, the probe was removed from the electrostatic chuck, taking an interval of time, which was a dechucking time measured as an dechucking response time. The probe had a contact area of 3 cm$^2$, and the applied voltage was 2,000 V/mm, while the measurement was made at room temperature. For examples 5 and 6, their chucking forces were both as high as about 50 Torr, and their dechucking response times were both within a range of 1 sec. or less, thus exhibiting a favorable dechucking response.

According to the embodiments described, a yttria sintered body is allowed to have an enhanced corrosion resistance and mechanical strength, a ceramic member is allowed to have an enhanced mechanical strength without undue loss of corrosion resistance, and a manufacturing method of yttria sintered body is allowed in a facilitated manner to provide a yttria sintered body with on enhanced corrosion resistance and mechanical strength.

While preferred embodiments of the present invention have been described using specific terms, such description is for illustrative purposes, and it is to be understood that changes and variations may be made without departing from the spirit or scope of the claims.

What is claimed is:

1. A yttria sintered body comprising silicon nitride in an amount of 5 to 40 vol. %, yttria in an amount of 60 to 95 vol. %, and a sintering additive in an amount of 0 to 5 vol. %.

2. The yttria sintered body as claimed in claim 1, wherein the silicon nitride has an average grain size within a range of 0.01 to 5.0 µm.

3. The yttria sintered body as claimed in claim 1, having a flexural strength of 250 MPa or more.

4. The yttria sintered body as claimed in claim 1, having a fracture toughness of 1.5 MPa·m$^{1/2}$ or more.

5. The yttria sintered body as claimed in claim 1, having a relative density of 98% or more.

6. The yttria sintered body as claimed in claim 1, having a volume resistivity of $1\times10^{15}$ Ω·cm or more at a room temperature.

7. The yttria sintered body as claimed in claim 1, having a specific inductive capacity of 10 or more.

8. The yttria sintered body as claimed in claim 1, sintered by a hot press method.

9. A ceramic member comprising:

a base member comprising, at least in part, a toughened yttria sintered body including silicon nitride in an amount of 5 to 40 vol. %, yttria in an amount of 60 to 95 vol. %, and a sintering additive in an amount of 0 to 5 vol. %; and a metallic member buried in the member.

10. The ceramic member as claimed in claim 9, comprising: a terminal configured to connect the metallic member to a power supply member; and a connecting member buried in the ceramic member, and configured to be joined to the metallic member and the terminal, for interconnection therebetween.

11. The ceramic member as claimed in claim 10, wherein the connecting member has a distance of 1 mm or more between a joint side thereof with the metallic member and a joint side thereof with the terminal.

12. The ceramic member as claimed in claim 9, wherein the ceramic member comprises an electrostatic chuck comprising a chuck body, an electrostatic electrode comprising the metallic member formed on the chuck body, and a dielectric layer formed on the electrostatic electrode, wherein at least one of the chuck body and the dielectric layer is made of the toughened yttria sintered body.

13. The ceramic member as claimed in claim 12, wherein the chuck body is made of the yttria sintered body, and the dielectric layer is made of a high-permittivity yttria sintered body of a specific inductive capacity of 10 or more by a purity of 99.9% by weight or more.

14. The ceramic member as claimed in claim 9, wherein the ceramic member comprises an electric heater comprising a heater body and a resistance heating element comprising the metallic member buried in the heater body, wherein at least a part of the heater body is made of the toughened yttria sintered body.

15. The ceramic member as claimed in claim 9, wherein the ceramic member comprises a susceptor comprising a susceptor body and an RF electrode comprising the metallic member buried in the susceptor body, and wherein at least a part of the susceptor body is made of the toughened yttria sintered body.

16. A ceramic member for semiconductor manufacturing, wherein at least a part of the ceramic member, which is exposed to a corrosive gas, comprises a yttria sintered body including silicon nitride in an amount of 5 to 40 vol. %, yttria in an amount of 60-95 vol. %, and a sintering additive in an amount of 0 to 5 vol. %.

17. A method for manufacturing a yttria sintered body comprising the steps of: preparing a raw powder including yttria in an amount of 60 to 95 vol. %, a sintering additive in an amount of 0 to 5 vol. %, and silicon nitride in an amount of 5 to 40 vol. %; forming the raw powder to form a compact; and sintering the compact in an inactive gaseous atmosphere at temperatures within 1,500 to 2,000° C.

18. The manufacturing method as claimed in claim 17, wherein the step of sintering the compact comprises a hot press method.

* * * * *